(12) United States Patent
Takamine

(10) Patent No.: US 6,700,460 B2
(45) Date of Patent: Mar. 2, 2004

(54) SURFACE ACOUSTIC WAVE FILTER

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/167,853

(22) Filed: Jun. 12, 2002

(65) Prior Publication Data

US 2002/0190816 A1 Dec. 19, 2002

(30) Foreign Application Priority Data

Jun. 12, 2001 (JP) ........................................ 2001-177329
Apr. 17, 2002 (JP) ........................................ 2002-114934

(51) Int. Cl.7 ................................................ H03H 9/64
(52) U.S. Cl. ..................... 333/195; 333/193; 333/313 R
(58) Field of Search ................................ 333/195, 193, 333/313 R; 310/313 D, 313 R, 313 B

(56) References Cited

U.S. PATENT DOCUMENTS 5,694,096 A * 12/1997 Ushiroku et al. ........... 333/195
5,770,985 A * 6/1998 Ushiroku et al. ........... 333/195
6,137,380 A 10/2000 Ushiroku et al.
6,265,808 B1 * 7/2001 Taniguchi ............... 310/313 R
6,384,698 B1 * 5/2002 Hayashi et al. ............. 333/195
6,518,861 B2 * 2/2003 Taniguchi ................... 333/195

FOREIGN PATENT DOCUMENTS

| JP | 05-267990 | 10/1993 |
| JP | 07-030366 | 1/1995 |
| JP | 11-234085 | 8/1999 |

* cited by examiner

Primary Examiner—Michael Tokar
Assistant Examiner—Lam Mai
(74) Attorney, Agent, or Firm—Keating & Bennett, LLP

(57) ABSTRACT

A longitudinally-coupled resonator mode SAW filter portion having at least two interdigital transducers (IDTs) is disposed on a piezoelectric substrate. At least one SAW resonator is electrically connected in parallel with the SAW filter portion such that the at least one SAW resonator is disposed between an input terminal or an output terminal and the SAW filter portion. The resonance point of the SAW resonator is disposed in the pass band of the SAW filter portion.

18 Claims, 17 Drawing Sheets

SURFACE ACOUSTIC WAVE FILTER

BACKGROUND OF THE INVENTION

1. Field of the Invention

The present invention generally relates to a surface acoustic wave (SAW) filter for use as, for example, a bandpass filter, and to a communication apparatus including such a SAW filter. More particularly, the present invention relates to a SAW filter provided with a SAW filter portion and a SAW resonator electrically connected to the SAW filter portion on a piezoelectric substrate.

2. Description of the Related Art

The latest cellular telephone systems, along with an increase in the number of subscribers and a wider variety of services, use an increased frequency range. Accordingly, there is a strong demand for an increase in the pass bandwidth in SAW filters, which are widely used as bandpass filters in the RF stage of cellular telephones.

On the other hand, it is desired that the sensitivity of cellular telephones be uniform in all frequency channels. Accordingly, variations in the insertion loss in the pass band must be small.

Previously, longitudinally-coupled resonator mode SAW filters have been widely used as bandpass filters in the RF stage of cellular telephones. Japanese Unexamined Patent Application Publication No. 5-267990 discloses the structure of a longitudinally-coupled resonator mode SAW filter in which the pass bandwidth can be increased while reducing the insertion loss. In this SAW filter, three interdigital transducers (IDTs) are disposed on a 64° Y-cut X-propagating $LiNbO_3$ substrate having a large electromechanical coupling coefficient, and the center-to-center distance (pitch) of adjacent electrode fingers of the IDTs is $\lambda/4$, to thereby increase the pass bandwidth.

However, in a longitudinally-coupled resonator mode SAW filter, when increasing the pass bandwidth, the uniformity of the insertion loss in the pass band is decreased.

SUMMARY OF THE INVENTION

In order to solve the problems described above, preferred embodiments of the present invention provide a surface acoustic wave filter including a piezoelectric substrate, a surface acoustic wave filter portion disposed on the piezoelectric substrate and having at least one interdigital transducer arranged to extend in a direction in which a surface acoustic wave propagates, and at least one surface acoustic wave resonator electrically connected in parallel with the surface acoustic wave filter portion such that the at least one surface acoustic wave resonator is disposed between an input terminal or an output terminal and the surface acoustic wave filter portion, wherein a resonance point or a sub-resonance point of the surface acoustic wave resonator is disposed in a pass band of the surface acoustic wave filter portion.

Preferred embodiments of the present invention have the advantage of providing a SAW filter with a balanced conversion function in which the uniformity of the insertion loss in the pass band is significantly increased. Also, the variation in the insertion loss in the pass band is minimized even if filtering characteristics are changed due to changes in temperature.

A SAW filter according to preferred embodiments of the present invention is advantageous since the deviation of the insertion loss in the pass band is minimized by utilizing the response at the resonance or sub-resonance point of the SAW resonator.

In the aforementioned SAW filter, the resonance or sub-resonance point of the SAW resonator may substantially coincide with the frequency at which the insertion loss in the pass band of the SAW filter portion is minimized. With this arrangement, the deviation of the insertion loss in the pass band can be more effectively reduced by utilizing the resonance or sub-resonance point.

In the aforementioned SAW filter, where the resonance point of the SAW filter is disposed on the pass band of the SAW filter portion, the Q value of the SAW resonator may be about 190 or less. With this arrangement, the deviation of the insertion loss in the pass band can be more effectively reduced without the influence of ripple caused by the SAW resonator.

In the aforementioned SAW filter, where the sub-resonance point is disposed in the pass band of the SAW filter portion, the SAW resonator may include an IDT and reflectors disposed at both sides of the IDT in a SAW-propagating direction, and the center-to-center distance of electrode fingers between the IDT and each of the reflectors preferably is approximately $[(0.50$ through $0.80)+0.50n]$ times (n is $-1$, 0, 1, 2, and so on) a wavelength, which is determined by the electrode finger pitch of the IDT. With this arrangement, the deviation of the insertion loss in the pass band can be more effectively reduced.

A SAW filter according to preferred embodiments of the present invention may further include a pair of balanced signal terminals and an unbalanced signal terminal, thereby providing a balanced-to-unbalanced conversion function. In this case, it is possible to provide a SAW filter having a balanced-to-unbalanced conversion function in which the deviation of the insertion loss in the pass band is effectively minimized.

The present invention also provides a communication apparatus including a bandpass filter that is constituted by one of the SAW filters according to the preferred embodiments described above.

It is thus possible to obtain a communication apparatus having a bandpass filter provided with a balanced-to-unbalanced conversion function in which the uniformity of the insertion loss in the pass band is high, and the variation in the filtering characteristics due to temperature changes is small. Thus, such a communication apparatus has high transmission or reception characteristics.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

The present invention is described in detail below with reference to the accompanying drawings through illustration of preferred embodiments.

Figure 1:
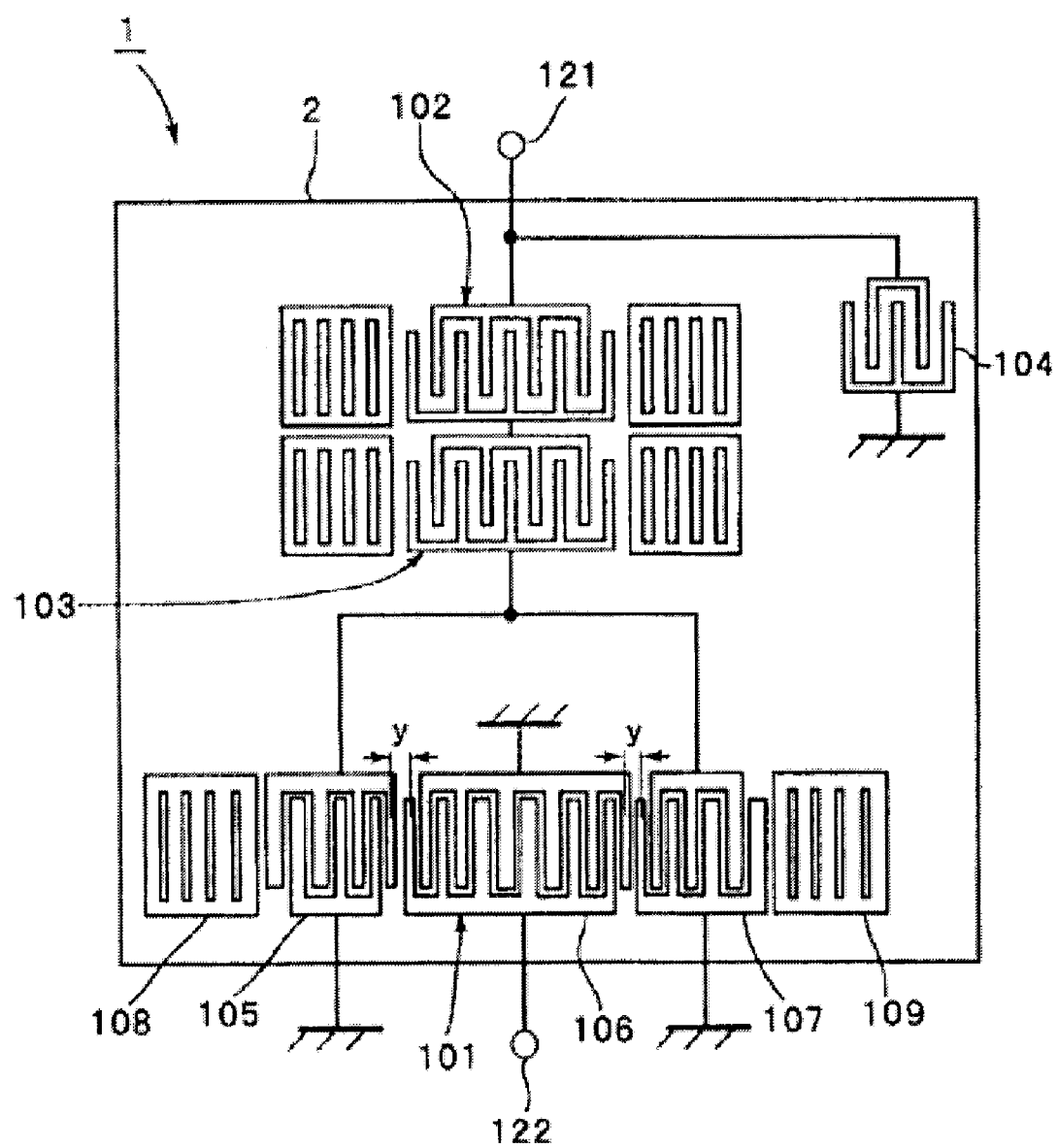
FIG. 1 is a plan view schematically illustrating a SAW filter according to a first preferred embodiment of the present invention.

FIG. 1 is a plan view schematically illustrating a SAW filter 1 according to a first preferred embodiment of the present invention. In the following preferred embodiments, the SAW filter is discussed in the context of a personal cellular system (PCS) transmission filter.

In this preferred embodiment, a piezoelectric substrate 2 that is preferably a 40±5° Y-cut X-propagating LiTaO$_3$ substrate is used. On the piezoelectric substrate 2, a longitudinally-coupled resonator mode SAW filter portion 101, and SAW resonators 102, 103, and 104 are preferably disposed and made of aluminum (Al) electrodes. The SAW resonators 102 and 103 are connected in series to each other between the SAW filter portion 101 and an input signal terminal 121. The SAW resonator 104 is connected in parallel with the input terminal of the SAW filter portion 101. That is, the SAW resonator 104 is connected between the input terminal and a ground potential.

In the SAW filter portion 101, IDTs 105, 106, and 107 are arranged in a SAW propagating direction, and reflectors 108 and 109 are arranged such that they sandwich the IDTs 105, 106, and 107 therebetween.

FIG. 1 shows that the pitch between electrode fingers between the IDTs 105 and 106 and that between the IDTs 106 and 107 are preferably narrower than that of the other electrode fingers. That is, a plurality of narrow-pitch electrode fingers are provided at the portions between adjacent IDTs.

One end of the central IDT 106 is connected to an output terminal 122, and the other end thereof is connected to a ground potential. One end of each of the IDTs 105 and 107 is connected to the input terminal 121 via the SAW resonators 102 and 103, and the other ends thereof are connected to ground potentials.

For the sake of simplicity, only a small number of electrode fingers are shown in FIG. 1. The specifications of the SAW filter portion 101 are preferably as follows (the number in parentheses indicates the number of narrow-pitch electrode fingers, and the wavelength determined by the narrow pitch of the electrode fingers is indicated by $\lambda I_2$, and the wavelength determined by the regular pitch of the electrode fingers is indicated by $\lambda I_1$):

interdigital length W of the IDTs 105, 106, and 107: about 60.6$\lambda I_1$;

number of electrode fingers of IDT 105: 29(4);

number of electrode fingers of IDT 106: (4)44(4);

number of electrode fingers of IDT 107: (4)29;

IDT wavelength $\lambda I_1$: about 2.06 μm;

IDT wavelength $\lambda I_2$: about 1.88 μm;

reflector wavelength $\lambda R$: about 2.07 μm;

number of electrode fingers of reflector: 100;

IDT pitch (center-to-center distance) y: about 0.50$\lambda I_2$;

IDT-reflector pitch: about 0.50$\lambda R$;

duty (for IDT and reflectors): about 0.60; and electrode thickness: about 0.080$\lambda I_1$.

Detailed designs of the SAW resonator 102 preferably are as follows:

interdigital length W: about 49.1$\lambda$;

number of electrode fingers of IDT: 401;

wavelength $\lambda$ (for IDT and reflectors): about 2.04 μm;

number of electrode fingers of reflectors: 30

IDT-reflector pitch: about 0.50$\lambda$;

duty (for IDT and reflectors): about 0.60; and electrode thickness: about 0.080$\lambda$.

Detailed designs of the SAW resonator 103 preferably are as follows:

interdigital length W: about 40.6$\lambda$;

number of electrode fingers of IDT: 241;

wavelength $\lambda$ (for IDT and reflectors): about 1.97 μm;

number of electrode fingers of reflectors: 30

IDT-reflector pitch: about 0.50$\lambda$;

duty (for IDT and reflectors): about 0.60; and electrode thickness: about 0.084$\lambda$.

Detailed designs of the SAW resonator 104 preferably are as follows:

interdigital length W: about 2.5$\lambda$;

number of electrode fingers of IDT: 31;

wavelength $\lambda$ (for IDT and reflectors): about 1.99 μm;

duty: about 0.60; and electrode thickness: about 0.083λ.

Figure 2:
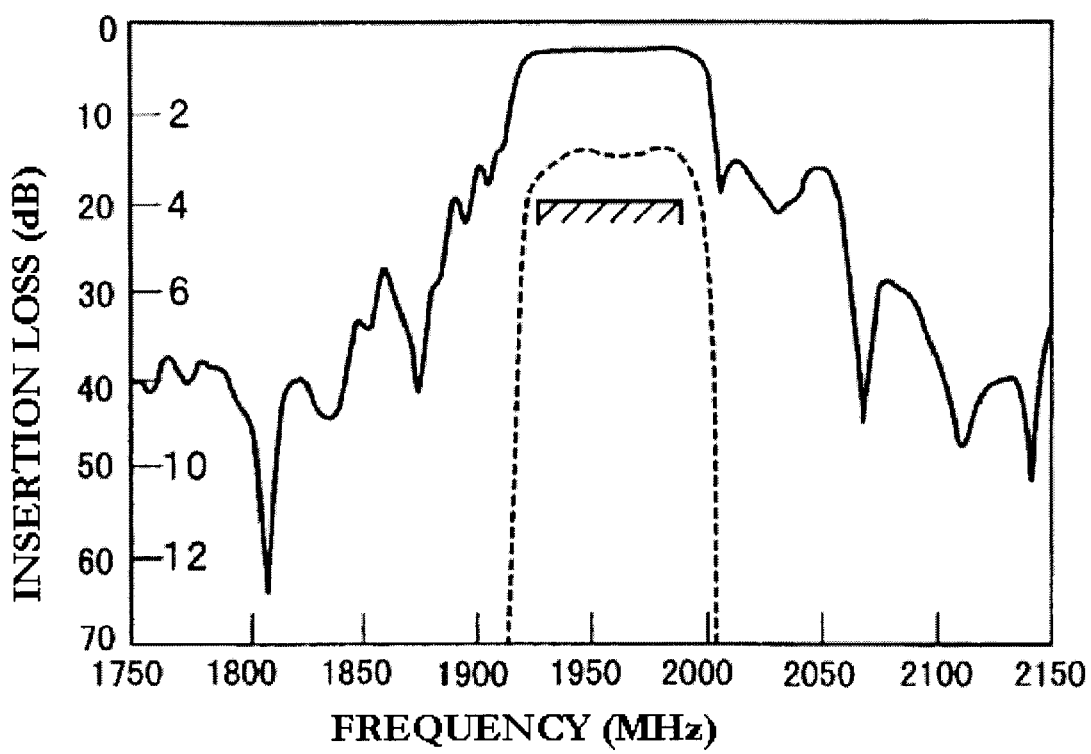
FIG. 2 illustrates the frequency-vs-amplitude characteristic of the SAW filter shown in FIG. 1.
Figure 3:
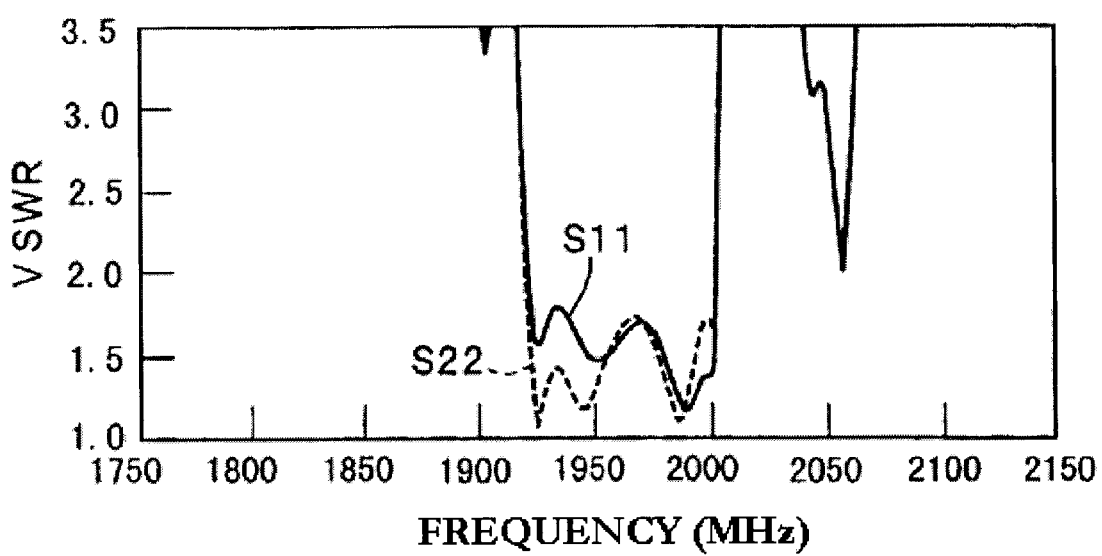
FIG. 3 illustrates the frequency-vs-voltage-standing-wave-ratio (VSWR) characteristic of the SAW filter shown in FIG. 1.

The frequency-vs-amplitude characteristic of the SAW filter of this preferred embodiment is shown in FIG. 2, and the frequency-vs-voltage-standing-wave-ratio (VSWR) characteristic is shown in FIG. 3.

Figure 4:
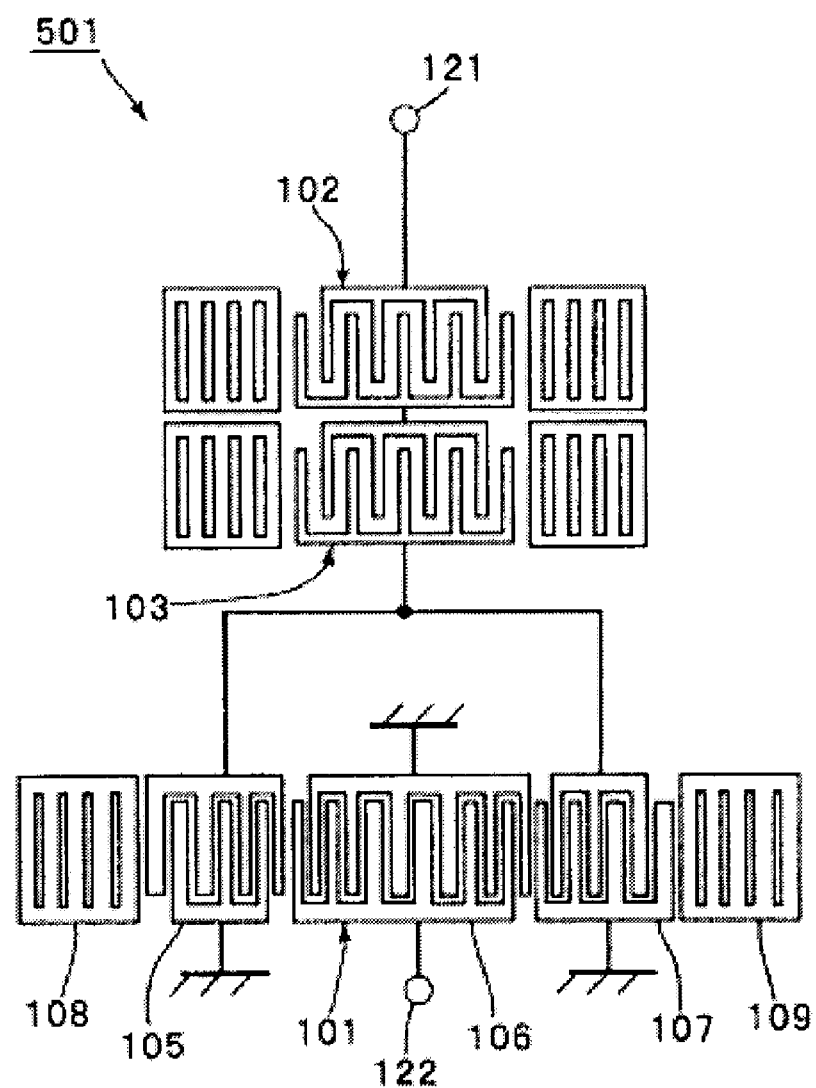
FIG. 4 is a plan view schematically illustrating the electrode structure of a known SAW filter prepared for comparison with the first preferred embodiment of the present invention.

For comparison, a SAW filter 501 shown in FIG. 4 was prepared. The SAW filter 501 is configured similarly to the SAW filter 1 shown in FIG. 1, except that the SAW resonator 104 is not provided. The SAW filter 501 is hereinafter considered as an example of a known SAW filter.

Figure 5:
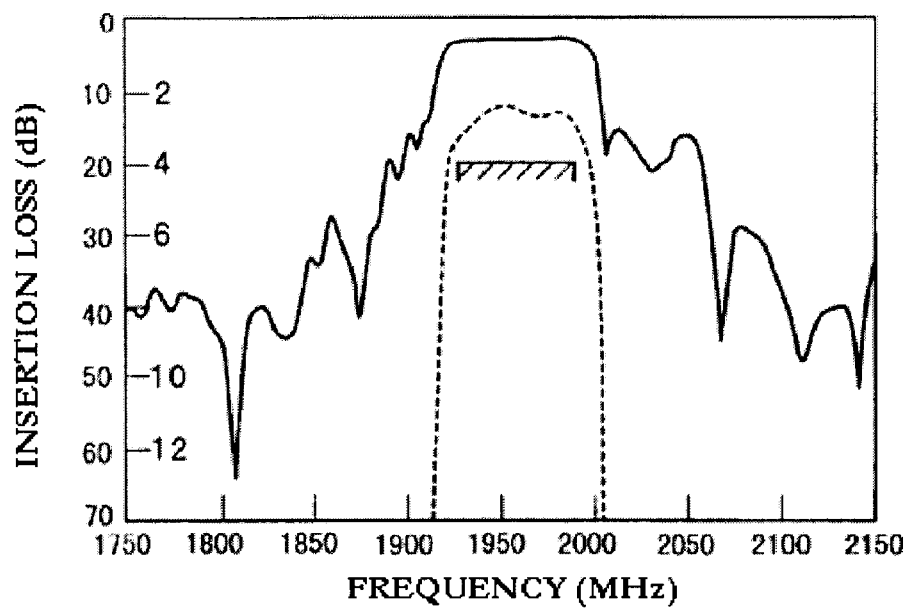
FIG. 5 illustrates the frequency-vs-amplitude characteristic of the known SAW filter shown in FIG. 4.
Figure 6:
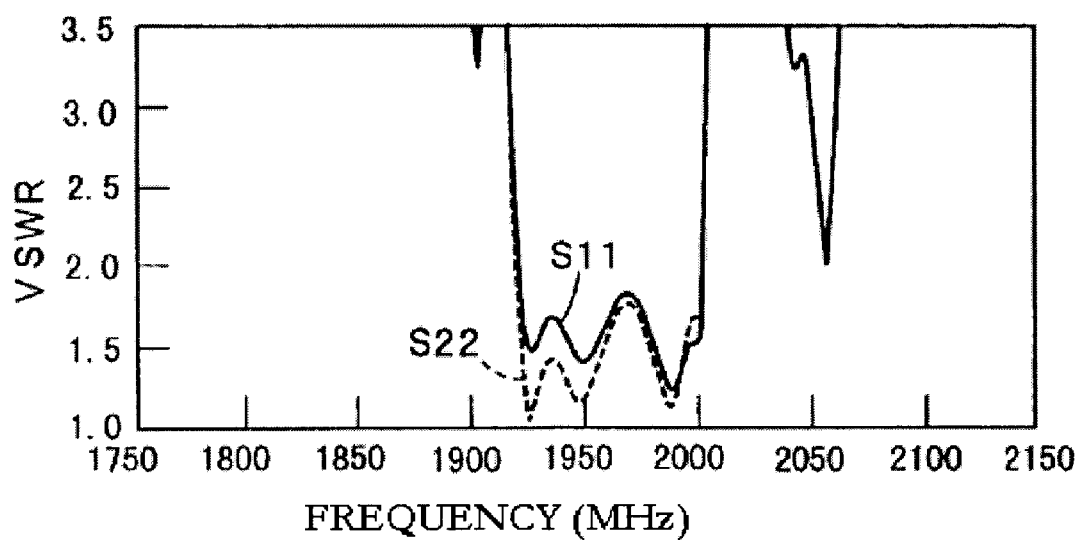
FIG. 6 illustrates the frequency-vs-VSWR characteristic of the known SAW filter shown in FIG. 4.

The frequency-vs-amplitude characteristic of the SAW filter 501 is shown in FIG. 5, and the frequency-vs-VSWR characteristic is shown in FIG. 6.

In FIGS. 2 and 5, the broken lines indicate the amplitude characteristic in which the insertion loss is enlarged to the scale shown at the right of the vertical axis. In FIGS. 3 and 6, S11 and S12 designate the input VSWR and the output VSWR, respectively.

As can be seen from FIGS. 2 and 5, the insertion loss within the pass band of the SAW filter of this preferred embodiment changes less sharply than that of the SAW filter 501, thereby improving the uniformity of the insertion loss. More specifically, in the 1930 MHz to 1990 MHz frequency range of a PCS transmission filter, the deviation of the insertion loss in the pass band of the SAW filter 501 is about 0.81 dB, while that of the SAW filter of the present preferred embodiment is about 0.48 dB. Thus, the amplitude characteristic is improved by about 0.33 dB.

The minimum insertion loss in the pass band of this preferred embodiment is greater than that of the SAW filter 501 by about 0.55 dB. With a small insertion loss, even if the deviation of the insertion loss in the pass band is small at room temperature, it increases due to temperature changes. In this preferred embodiment, since the minimum insertion loss in the pass band is greater, the deviation of the insertion loss in the pass band becomes smaller than the known SAW filter 501 even if the frequency-vs-amplitude characteristic changes in accordance with temperature changes. In terms of this feature, therefore, the deviation of the insertion loss in the pass band of this preferred embodiment can be decreased compared to that of the known SAW filter 501.

In this preferred embodiment, the pass bandwidth does not change significantly compared to the SAW filter 501. Additionally, FIGS. 3 and 6 show that the maximum VSWR in the pass band of this preferred embodiment is similar to that of the known SAW filter 501.

That is, in this preferred embodiment, the SAW resonator 104, which has a resonance point in the pass band of the SAW filter portion 101, is connected in parallel with the SAW filter portion 101. Thus, the variation in the insertion loss in the pass band can be reduced without decreasing the pass bandwidth and the VSWR.

Figure 7:
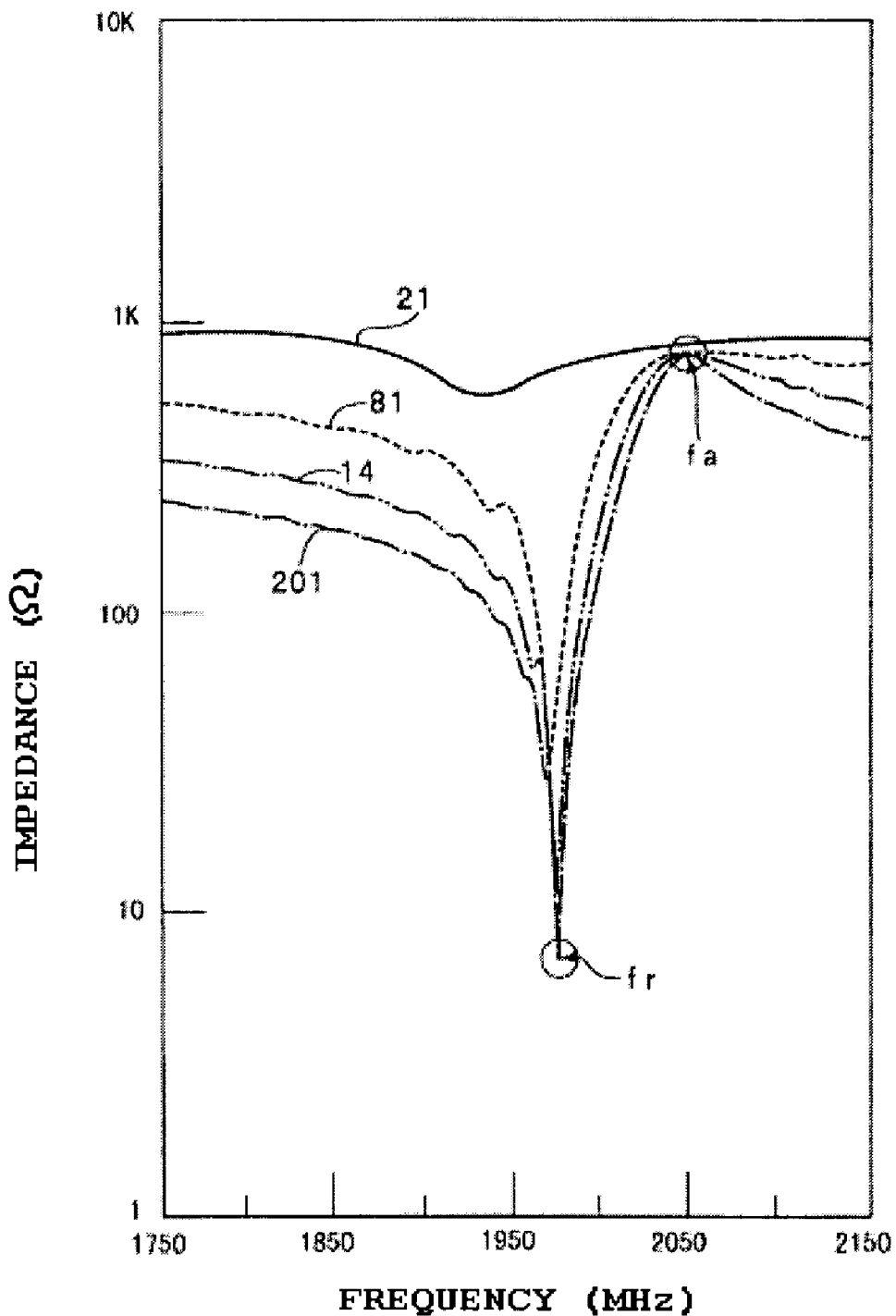
FIG. 7 illustrates a change in the impedance characteristic when the number of electrode fingers of an IDT of a SAW resonator is changed.

Additional features and advantages of preferred embodiments of the present invention are discussed below with reference to FIG. 7.

A plurality of the SAW resonators 104 used in this preferred embodiment were prepared by varying the number of electrode fingers of the IDT to 201, 141, 81, and 21 without changing the other design parameters. The impedance characteristic of such SAW resonators is shown in FIG. 7.

The resonance point fr and the antiresonance point fa appear in the impedance characteristic of the SAW resonators. By reducing the number of electrode fingers of the IDT of the SAW resonator, the Q value of the SAW resonators is decreased, and the peaks at the resonance point fr and the antiresonance point fa become less sharp, as shown in FIG. 7. By reducing the number of electrode fingers of the IDTs, the overall impedance characteristic is also shifted to a higher impedance range. Accordingly, when the number of electrode fingers of the IDT is 21, the antiresonance point fa does not appear distinctly in the impedance characteristic, and only the resonance point fr appears clearly. Thus, the impedance becomes substantially uniform except for the resonance point fr.

That is, by reducing the number of electrode fingers of the IDT, the SAW resonator serves as a resistor having a resistance that becomes minimal at one frequency and is constant at other frequencies. Such an impedance characteristic can also be achieved by suitably setting the parameters of the numbers of electrode fingers of the IDT.

In this preferred embodiment, the above-described SAW resonator is connected in parallel with the SAW filter portion, and it is preferable that the frequency with respect to the minimal impedance, i.e., the resonance point fr, of the SAW resonator substantially coincides with the frequency at which the insertion loss of the SAW filter portion is minimized. With this arrangement, the insertion loss within the pass band is partially increased, and the deviation of the insertion loss in the overall pass band can be significantly improved.

Since the impedance of the SAW resonator is shifted to a higher impedance range, the VSWR in the pass band and the pass bandwidth are not adversely influenced.

As is seen from the foregoing description, it is desirable that the SAW resonator connected in parallel with the SAW filter portion have a smaller Q value than known SAW resonators. If the Q value is too large, ripples appear in the pass band, which may increase the deviation of the insertion loss in the pass band. As design parameters for varying the Q value, various factors can be considered, such as the number of electrode fingers, the metallization ratio of the reflector or the IDTs, the electrode thickness, and the substrate material. In a practical sense, therefore it is impossible to determine the optimal ranges of all factors.

Figure 8:
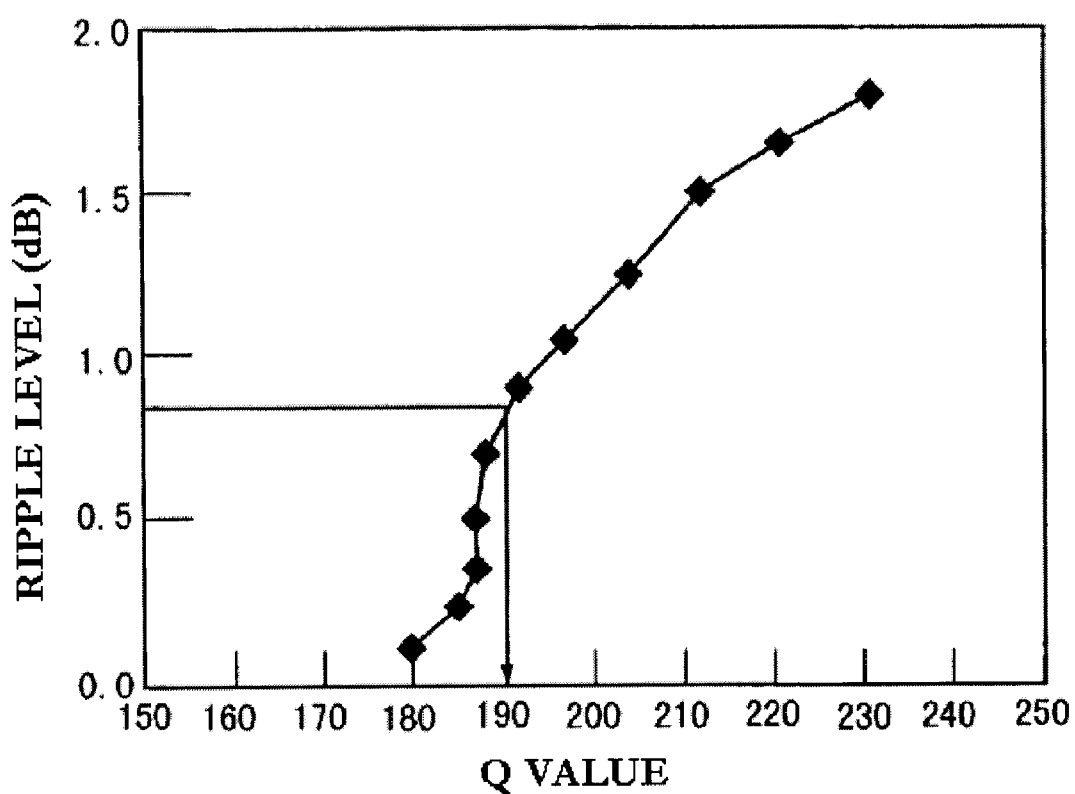
FIG. 8 illustrates a change in ripples appearing in the pass band by varying the Q value of a SAW resonator.

Accordingly, by checking a change in ripple by varying the Q value, the optimal range of the Q value in which the variation in the insertion loss in the pass band can be reduced while inhibiting the influence of the ripples was determined. The results are shown in FIG. 8. In FIG. 8, the vertical axis represents the ripple level, which indicates a dip in the attenuation-vs-frequency characteristic caused by ripple of the SAW resonator appearing in the center of the pass band of the SAW filter.

As is seen from FIG. 8, when the Q value of the SAW resonator is 190 or smaller, the ripple level is contained within about 0.81 dB or less, which is substantially equal to the variation in the insertion loss of the known SAW filter 501. That is, to decrease the deviation in the insertion loss in the pass band, compared to the known SAW filter 501, by utilizing the resonance point of a SAW resonator connected in parallel with a longitudinally-coupled resonator mode SAW filter, the Q value of the SAW resonator is preferably about 190 or smaller.

Figure 9:
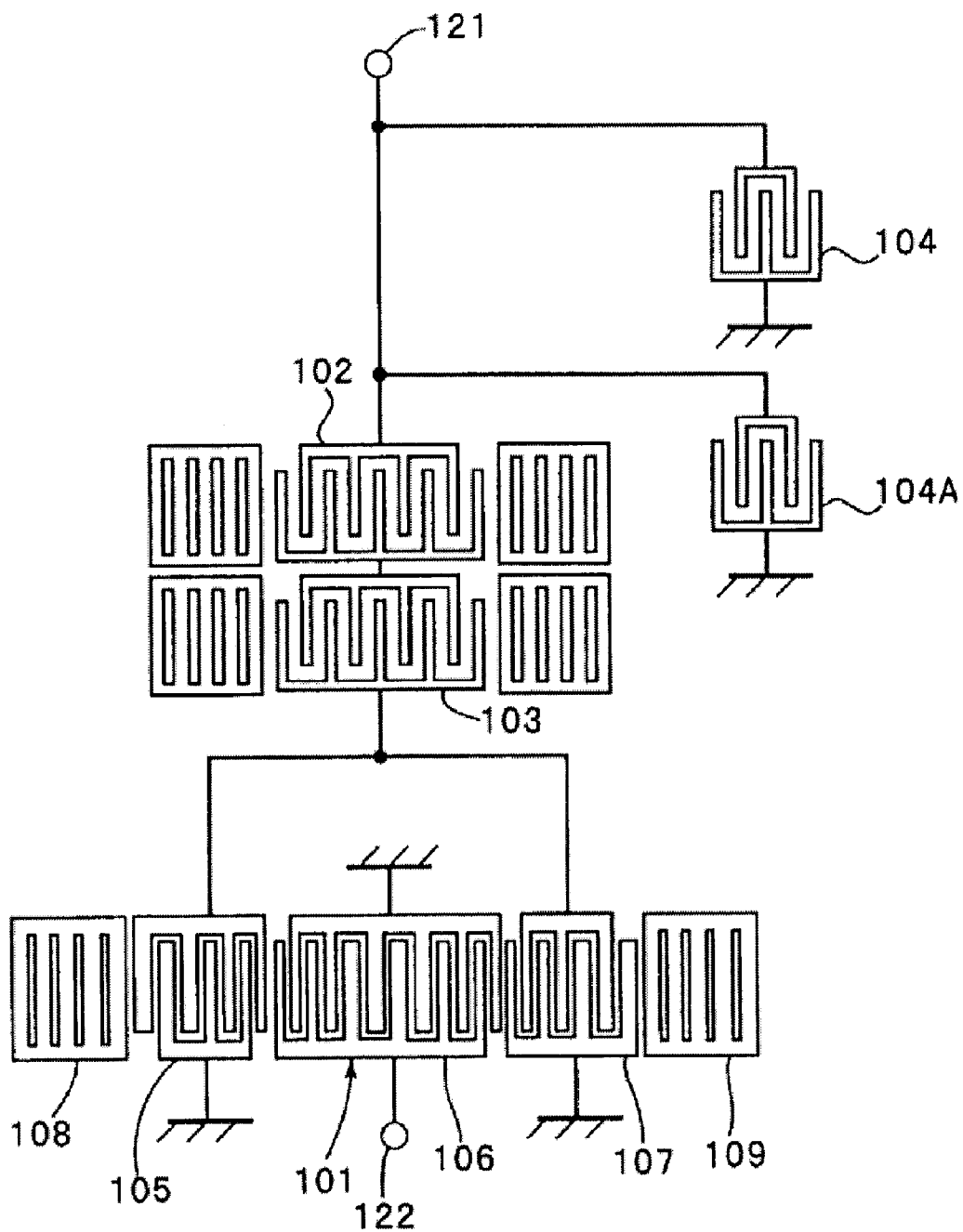
FIG. 9 is a plan view schematically illustrating a modified example of the SAW filter of the first preferred embodiment of the present invention.

Although in the first preferred embodiment only one SAW resonator 104 is connected in parallel with the SAW filter portion 101, a plurality of SAW resonators may be connected in parallel with the SAW filter portion 101. FIG. 9 illustrates a modification made to the first preferred embodiment in which the SAW resonator 104 and an extra SAW resonator 104A are connected in parallel with the SAW filter portion 101. In this modification, the total Q value of the SAW resonators 104 and 104A is preferably about 190 or smaller.

Figure 10:
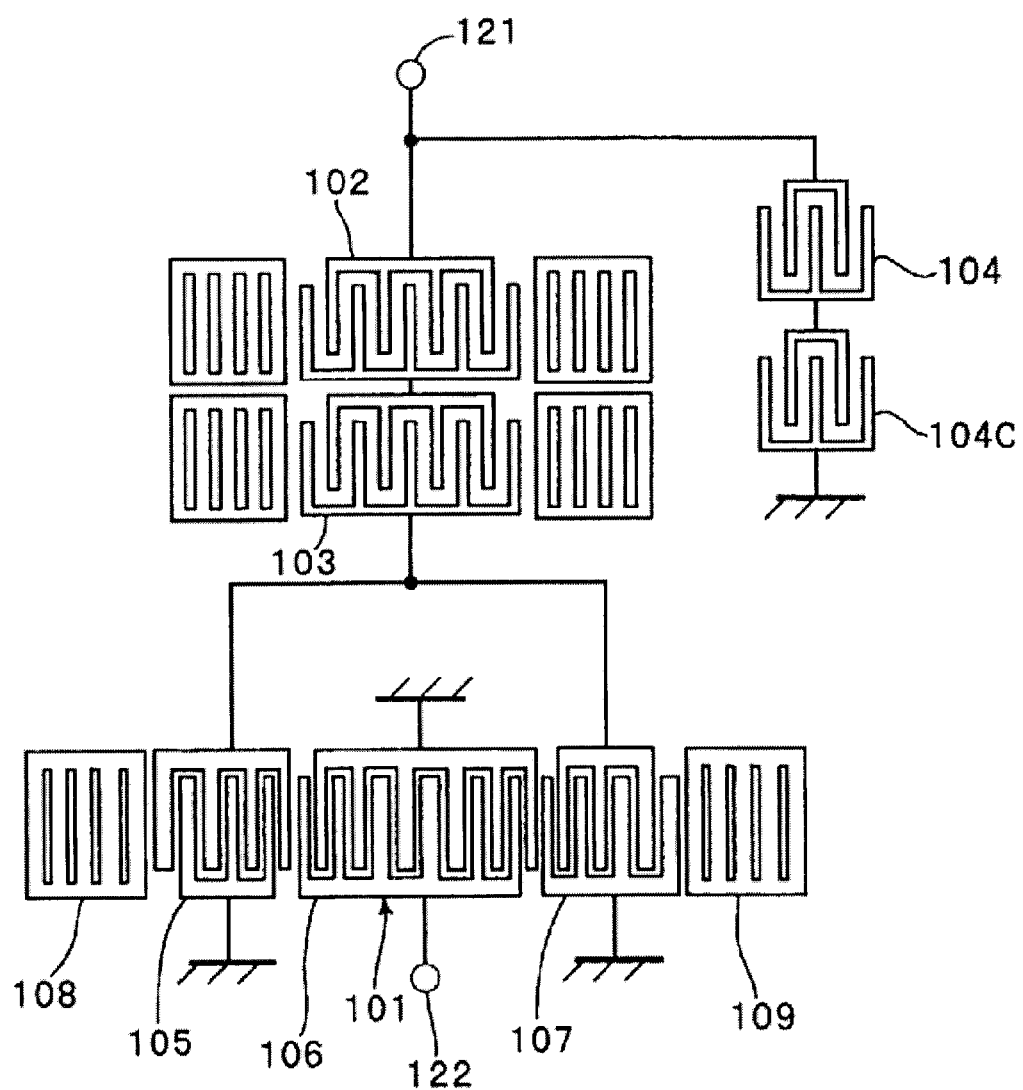
FIG. 10 is a plan view schematically illustrating another modified example of the SAW filter of the first preferred embodiment of the present invention.

FIG. 10 illustrates another modification made to the first preferred embodiment in which a SAW resonator 104C is connected in series to the SAW filter 104, which is connected in parallel with the SAW filter portion 101. Similarly, in this modification, the total Q value of the SAW resonators 104 and 104C is preferably about 190 or smaller.

A configuration in which a SAW resonator is connected in parallel with a SAW filter portion is known, as disclosed in Japanese Unexamined Patent Application Publication No. 7-030366. In such a configuration, however, the reason for connecting a SAW resonator in parallel with a SAW filter portion is to increase the attenuation in a range other than the pass band without increasing the insertion loss in the pass band. Accordingly, the resonance point of the SAW resonator connected in parallel with the SAW filter portion is set to match the frequency in a range other than the pass band at which the attenuation can be increased, and the antiresonance point is positioned in the pass band.

In contrast, in preferred embodiments of the present invention, the SAW resonator is connected in parallel with the SAW filter portion with a view to reducing the deviation in the insertion loss in the pass band. Accordingly, as stated above, the resonance point of the parallel-connected SAW resonator is positioned in the pass band, and more preferably, the resonance point substantially coincides with the frequency at which the insertion loss in the pass band is minimized. This increases the insertion loss on the one hand, but decreases the variation in the insertion loss in the pass band on the other hand. It should be noted, therefore, that the characteristics, advantages and configuration of preferred embodiments of the present invention are totally different from those of known SAW filters in which a SAW resonator is connected in parallel with a SAW filter portion.

Additionally, only a small number of electrode fingers of an IDT of a parallel-connected SAW resonator are required, and thus, a smaller SAW resonator can be used. Accordingly, the variation in the insertion loss in the pass band can be reduced without changing the size of the overall SAW filter.

Figure 11:
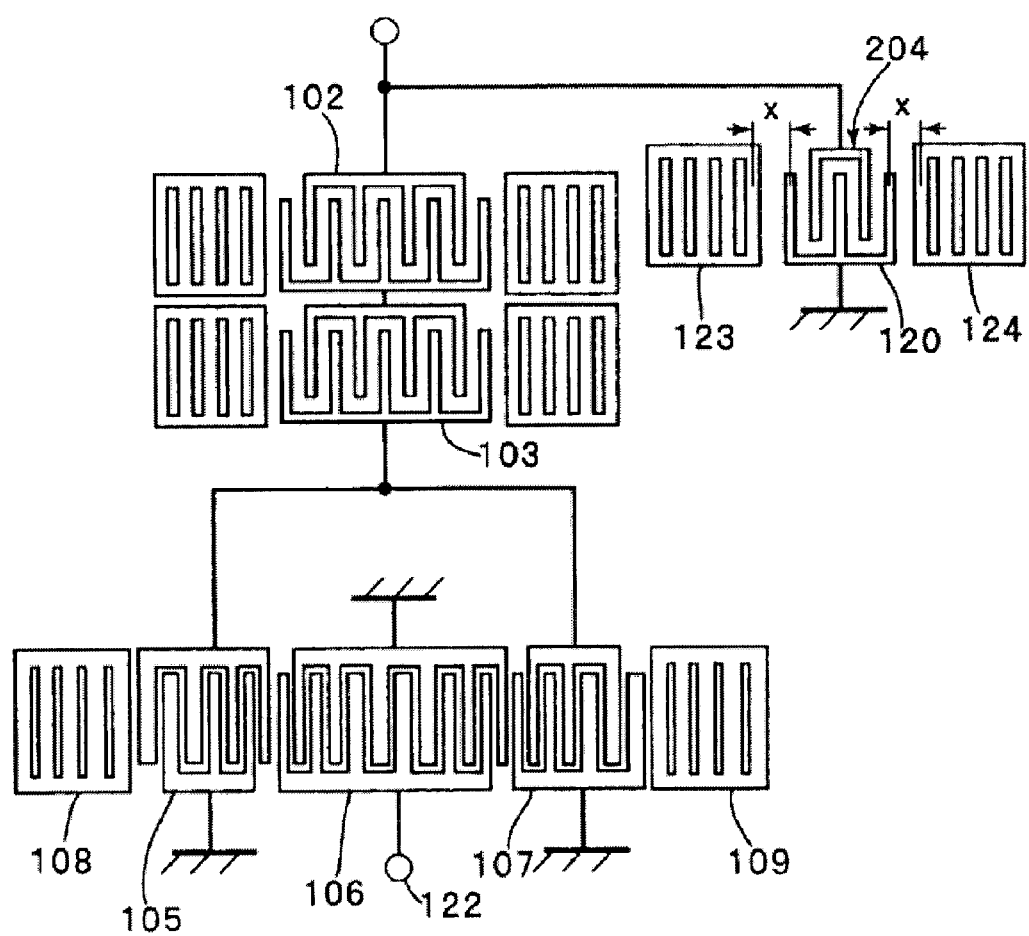
FIG. 11 is a plan view schematically illustrating the electrode structure of a SAW filter according to a second preferred embodiment of the present invention.

FIG. 11 is a plan view schematically illustrating the electrode structure of a SAW filter according to a second preferred embodiment of the present invention. As in the SAW filter of the first preferred embodiment, in the SAW filter of the second preferred embodiment, a 40±5° Y-cut X-propagating LiTaO$_3$ substrate is preferably used, though it is not shown, and the electrodes are disposed on this substrate. FIG. 11 shows that the electrode structure of the SAW filter of the second preferred embodiment is similar to that of the first preferred embodiment, except for the configuration of a SAW resonator 204 connected in parallel with the SAW filter portion 101. More specifically, in the SAW resonator 204, reflectors 123 and 124 are respectively disposed on the left and right sides of an IDT 120. Other features of the second preferred embodiment are similar to those of the first preferred embodiment, and thus, the same elements as those of the first preferred embodiment are indicated by like reference numerals, and an explanation thereof is omitted.

Detailed designs of the elements of the second preferred embodiment other than the SAW resonator 204 are configured similarly to those of the first preferred embodiment. Detailed designs of the SAW resonator 204 are preferably as follows:

interdigital length W: about 2.5λ;
number of electrode fingers of IDT: 101;
wavelength λ: about 2.09 μm;
numbers of electrode fingers of reflector: 10;
IDT-reflector pitch x: about 0.70λ;
duty: about 0.60; and
electrode thickness: about 0.083λ.

Figure 12:
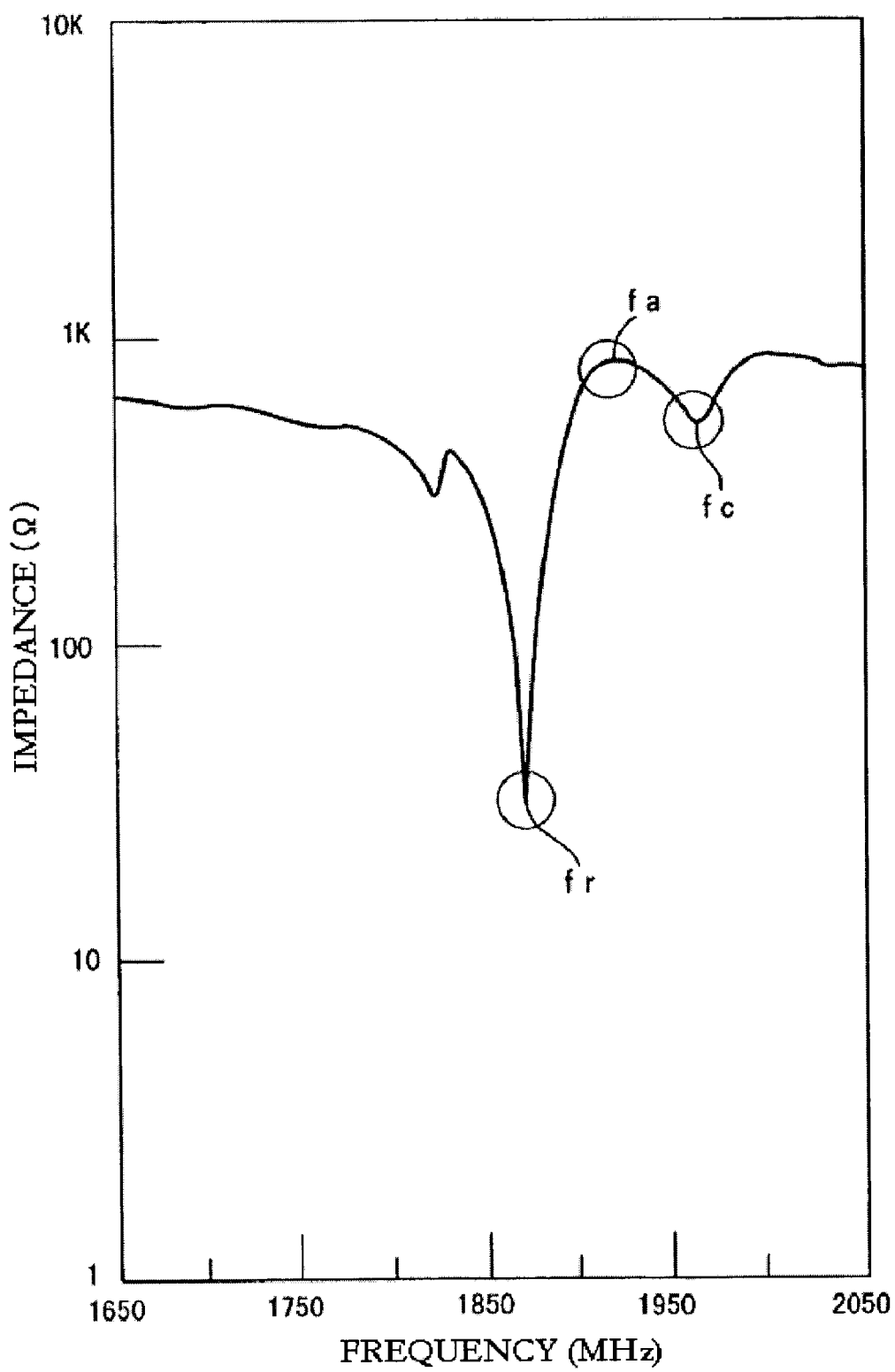
FIG. 12 illustrates the impedance characteristic of the SAW resonator used in the second preferred embodiment of the present invention.

FIG. 12 illustrates the impedance characteristic of the SAW resonator 204. As can be seen from FIG. 12, in the impedance characteristic of the SAW resonator 204, in addition to the resonance point fr and the antiresonance point fa, a sub-resonance point fc is generated. By setting the sub-resonance point fc to substantially match the frequency at which the insertion loss in the pass band is minimized, the insertion loss in the pass band is partially increased, thereby further reducing the variation in the insertion loss in the pass band. In the second preferred embodiment, because of the influence of the resonance point fr, the attenuation in a range other than the pass band, i.e., in a range lower than the pass band, can be advantageously increased.

Figure 13:
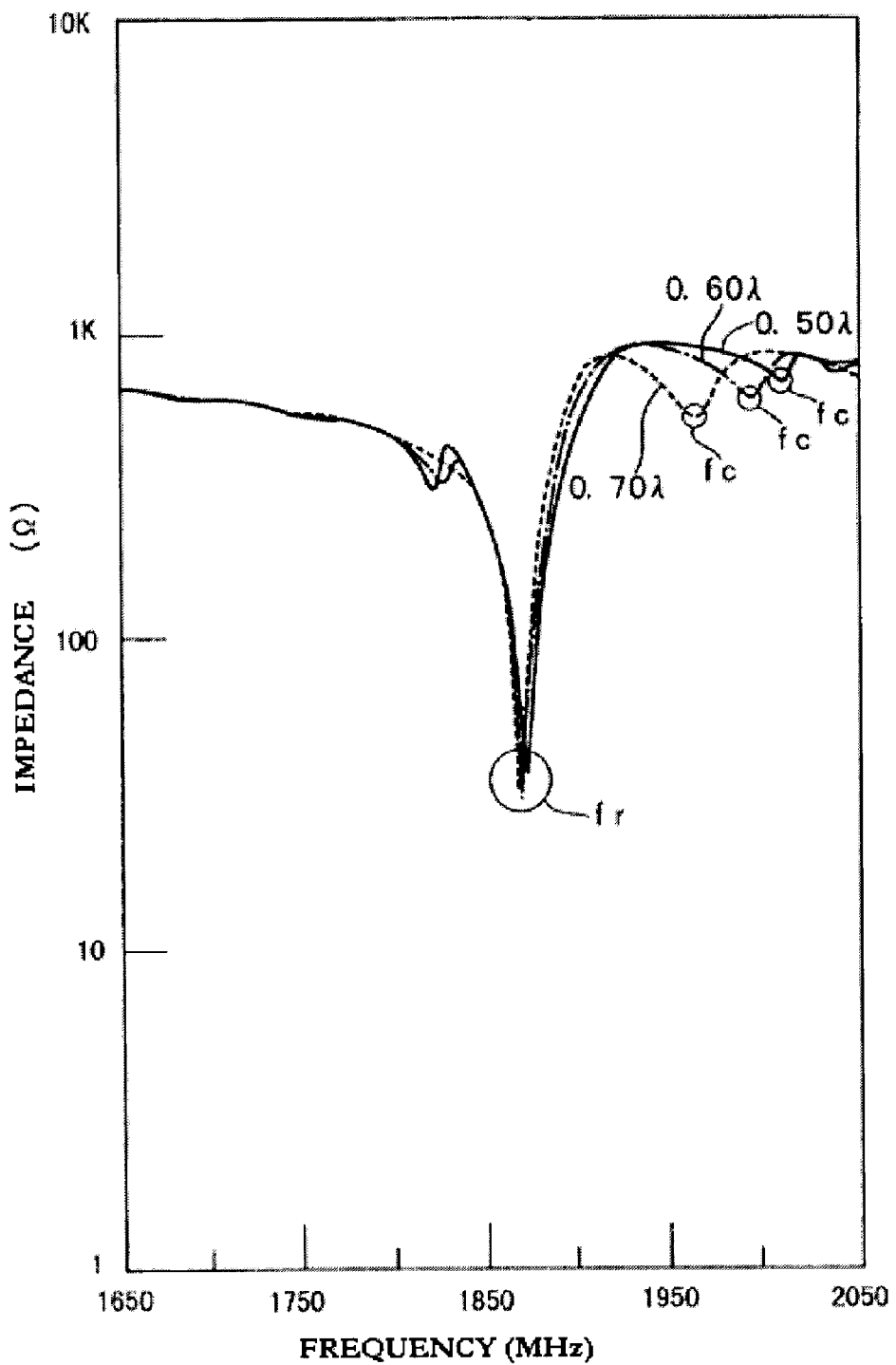
FIG. 13 illustrates an example of a change in the impedance characteristic by varying the IDT-reflector pitch.
Figure 14:
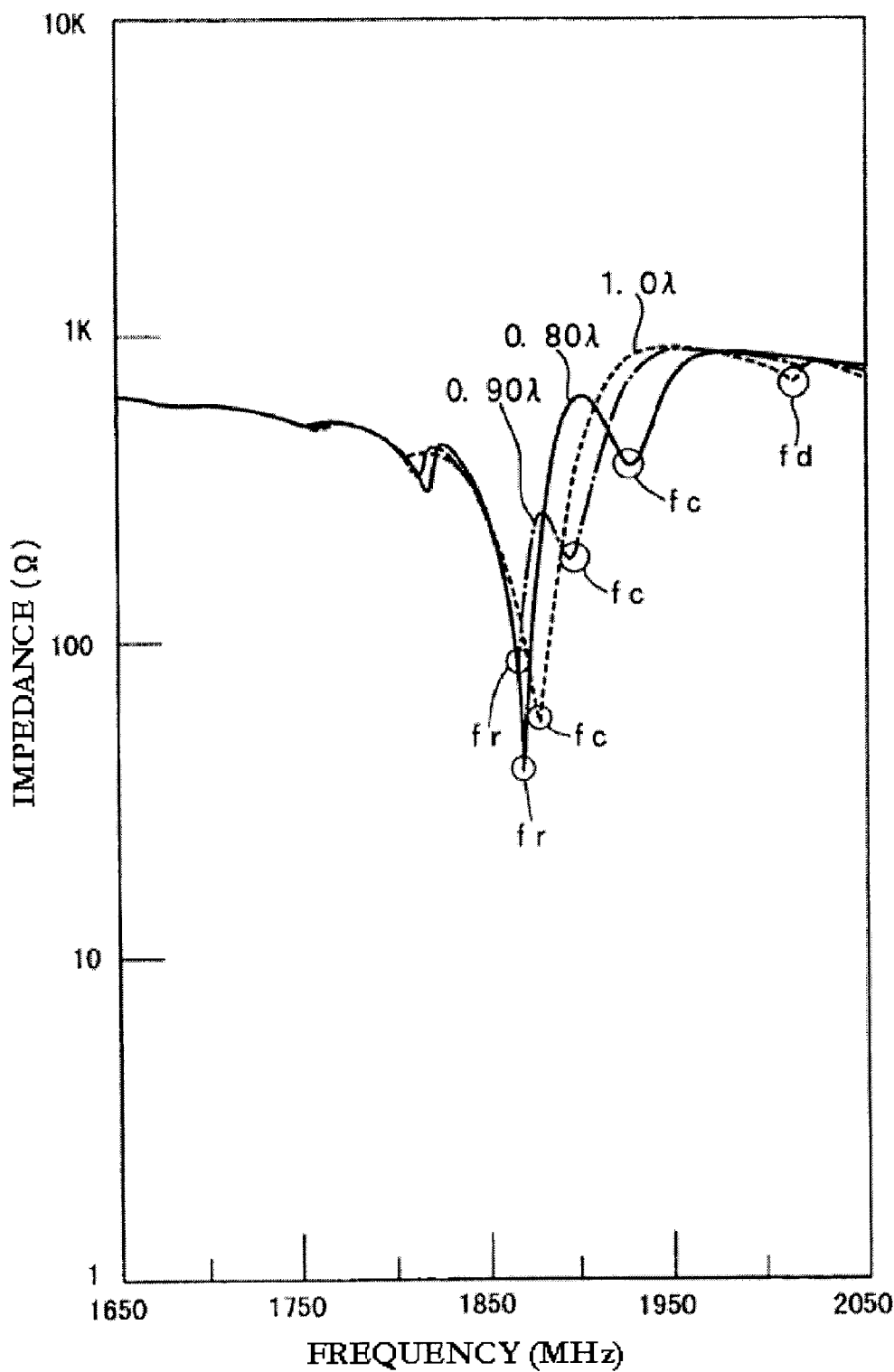
FIG. 14 illustrates another example of a change in the impedance characteristic by varying the IDT-reflector pitch.

As discussed above, the sub-resonance point fc of the SAW resonator can be generated by providing the reflectors 123 and 124. The frequency position and level of the sub-resonance point fc can be adjusted by changing the electrode finger pitch x between the IDT and the reflector. FIG. 13 illustrates the impedance characteristic when the IDT-reflector pitch x varies from about 0.50λ to about 0.70λ. FIG. 14 illustrates the impedance characteristic when the IDT-reflector pitch x varies from about 0.80λ to about 1.00λ.

FIGS. 13 and 14 show that the level of the sub-resonance point fc is decreased and is shifted toward the resonance point fr by increasing the IDT-reflector pitch x from about 0.50λ to about 1.00λ. By changing the IDT-reflector pitch x as discussed above, the frequency position and level of the sub-resonance point fc can be adjusted.

However, if the level of the sub-resonance point fc is too high, the variation in the insertion loss in the pass band may be disadvantageously increased. Accordingly, the IDT-reflector pitch x may preferably be set to a range such that the sub-resonance point fc is increased to be high enough to reduce the deviation of the insertion loss, i.e., a range of about 0.50λ to about 0.80λ.

When the IDT-reflector pitch x is increased to about 1.00λ, the resonance point fr becomes invisible and the sub-resonance point fc becomes the resonance point, and another sub-resonance point fd is generated. When the IDT-reflector pitch x is further increased to about 1.10λ, about 1.20λ, and so on, the sub-resonance point fd is changed in a manner similar to the sub-resonance point fc. When the IDT-reflector pitch x is increased to about 1.50λ, another sub-resonance point is generated. Accordingly, the advantage obtained by the sub-resonance point can be obtained every approximately 0.50λ of the IDT-reflector pitch, and thus, the preferable range of the IDT-reflector pitch x is approximately [(0.50λ through 0.80λ)+0.50n] times λ (n is −1, 0, 1, 2, and so on).

In the second preferred embodiment, the IDT-reflector pitch is changed to adjust the frequency position and level of the sub-resonance point. However, another method may be used. For example, the IDT may be divided into two or more IDT portions, and the pitch between the electrode fingers of the adjacent divided IDT portions may be adjusted. Alternatively, the reflector may be divided into two or more reflector portions, and the pitch between the electrode fingers of the adjacent divided reflector portions may be adjusted. Alternatively, the pitch or the duty of a few electrode fingers between the IDT and the reflector may be differentiated from the other electrode fingers, thereby adjusting the frequency position and level of the sub-resonance point.

Figure 15:
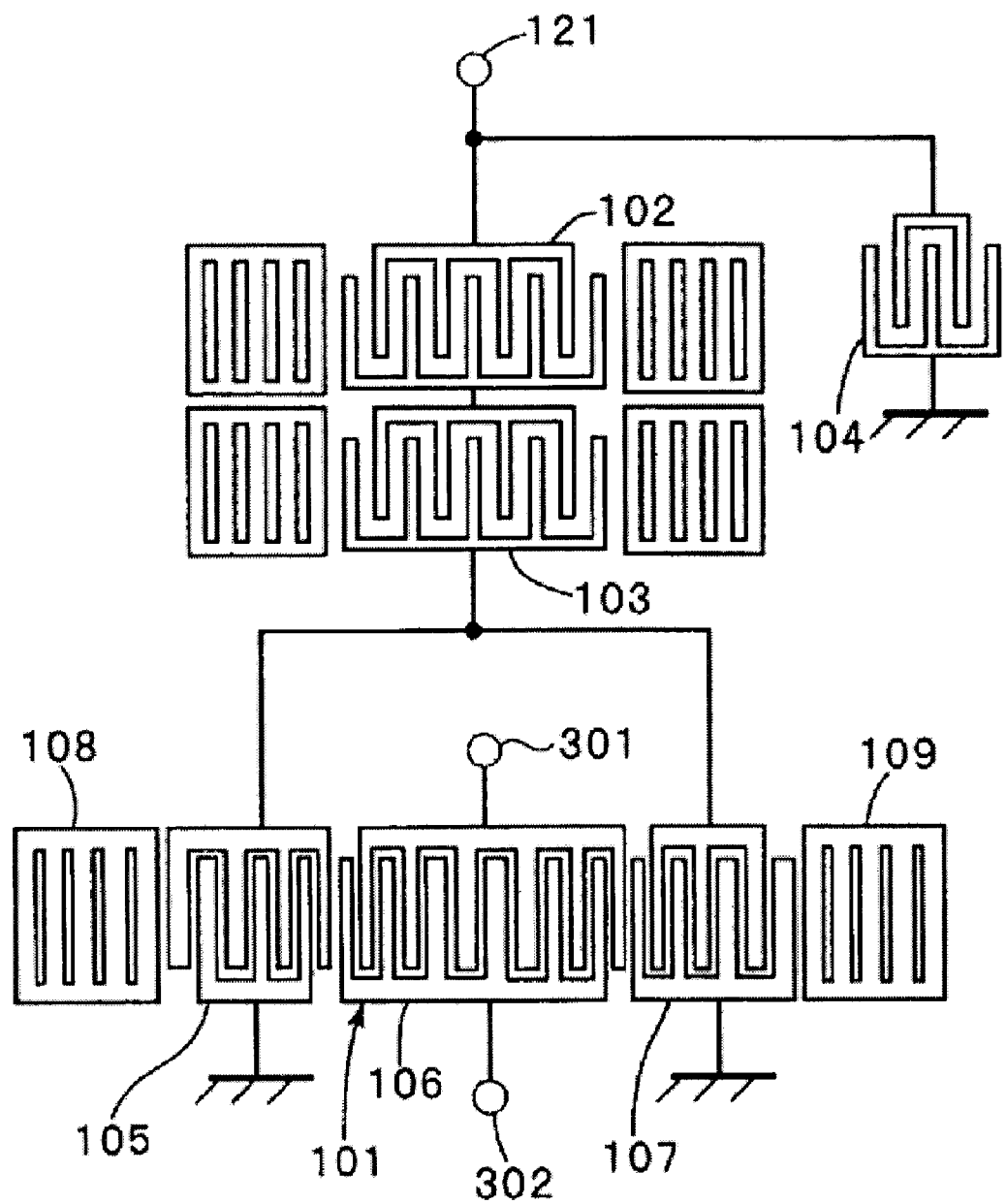
FIG. 15 is a plan view schematically illustrating the electrode structure of a SAW filter according to a third preferred embodiment of the present invention.

FIG. 15 is a plan view schematically illustrating the electrode structure of a SAW filter according to a third preferred embodiment of the present invention. The SAW filter of the third preferred embodiment is configured similarly to that of the first preferred embodiment, except that the central IDT 106 of the longitudinally-coupled resonator mode SAW filter portion 101 is connected to a pair of balanced signal terminals 301 and 302. By connecting the central IDT 106 of the SAW filter portion 101 to the pair of balanced signal terminals 301 and 302, a SAW filter provided with a balanced-to-unbalanced conversion function in which the input terminal 121 serving as an unbalanced signal terminal and the balanced signal terminals 301 and 302 are provided.

Accordingly, the third preferred embodiment is configured similarly to the first preferred embodiment, except that the balanced-to-unbalanced conversion function is provided. Thus, according to the third preferred embodiment, it is possible to provide a SAW filter provided with a balanced-to-unbalanced conversion function having a small deviation of the insertion loss in the pass band.

Figure 16:
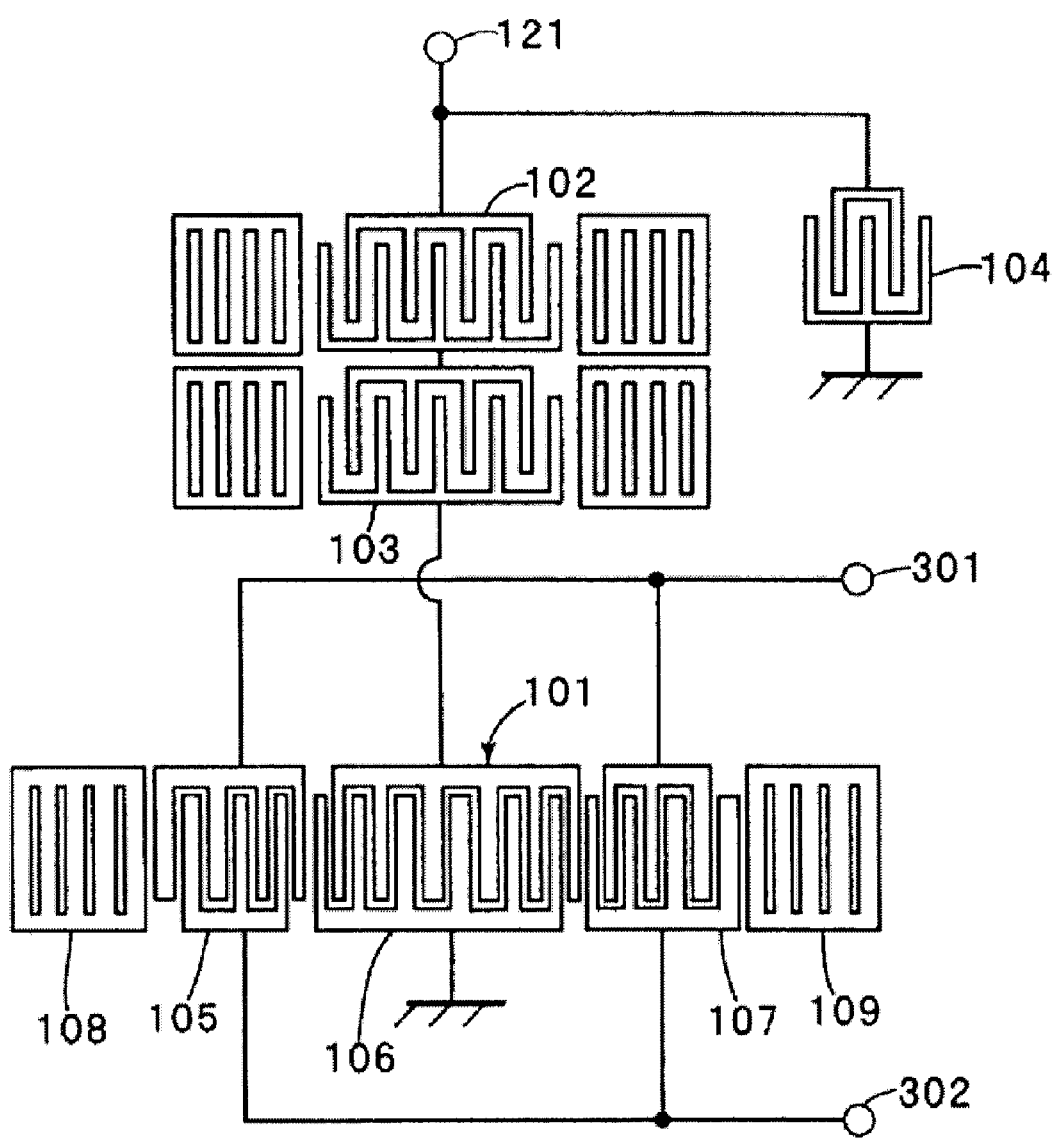
FIG. 16 is a plan view schematically illustrating a modified example of the SAW filter of the third preferred embodiment of the present invention.
Figure 17:
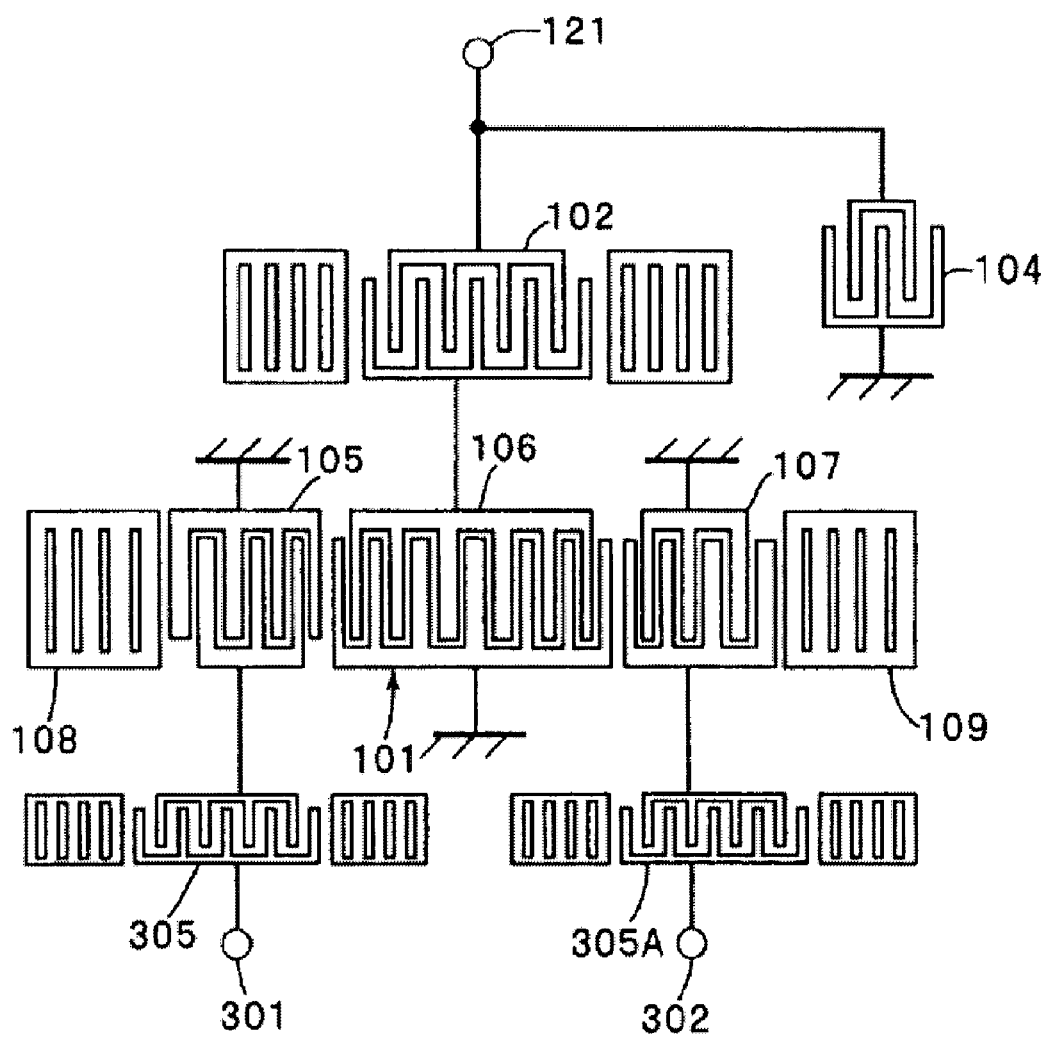
FIG. 17 is a plan view schematically illustrating another modified example of the SAW filter of the third preferred embodiment of the present invention.

In the third preferred embodiment, the central IDT 106 of the SAW filter portion 101 is connected to the pair of balanced signal terminals 301 and 302, as shown in FIG. 15. However, as shown in FIG. 16, the external IDTs 105 and 107 may be connected to the balanced signal terminals 301 and 302. Alternatively, as shown in FIG. 17, the external IDTs 105 and 107 may be connected to the balanced signal terminals 301 and 302, respectively. In FIG. 17, a SAW resonator 305 is connected in series between one end of the IDT 105 and the balanced signal terminal 301, while a SAW resonator 305A is connected in series between one end of the IDT 107 and the balanced signal terminal 302.

Figure 18:
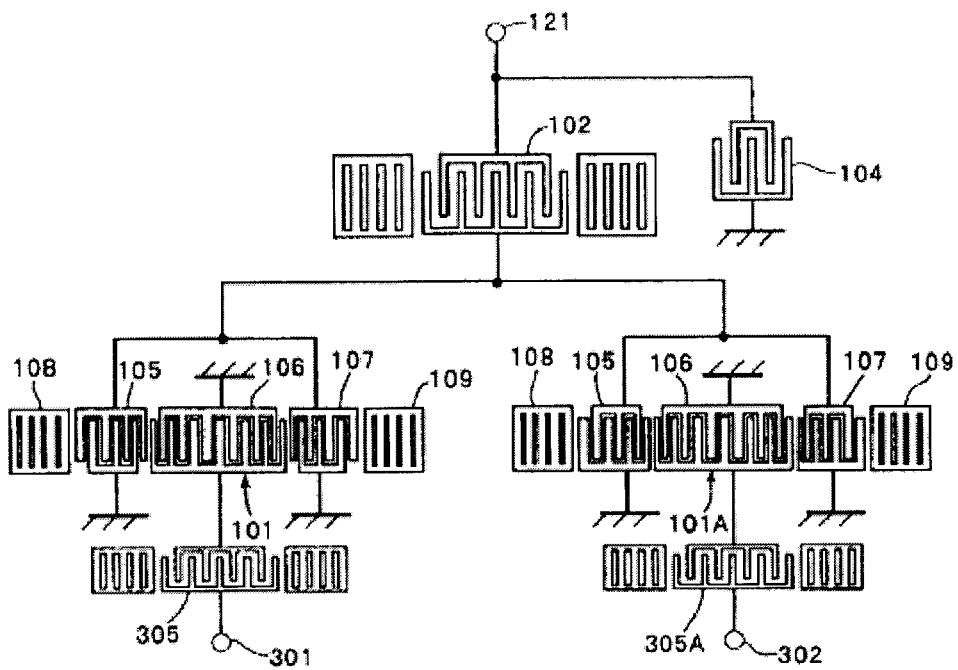
FIG. 18 is a plan view schematically illustrating still another modified example of the SAW filter of the third preferred embodiment of the present invention.

In another modification, as shown in FIG. 18, the SAW filter portion 101 and another SAW filter portion 101A may be connected in parallel with each other, and may be connected to the pair of balanced signal terminals 301 and 302, respectively. In the configuration shown in FIG. 18, the SAW resonators 305 and 305A are respectively connected in series between the central IDTs 106 of the SAW filter portions 101 and 101A and the balanced signal terminals 301 and 302. The other features of the modifications shown in FIGS. 16, 17, and 18 are similar to those of the third preferred embodiment, and thus, the deviation of the insertion loss in the pass band can also be reduced. It is thus possible to provide a SAW filter provided with a balanced-to-unbalanced conversion function, as in the third preferred embodiment.

In the first to third preferred embodiments, a 40±5° Y-cut X-propagating LiTaO$_3$ substrate is preferably used as the piezoelectric substrate. In the present invention, however, the piezoelectric substrate is not restricted to the above type of material, for example, a 64 °–72° Y-cut X-propagating LiNbO$_3$ substrate or a 41° Y-cut X-propagating LaNbO$_3$ substrate may be used, in which case, advantages similar to those offered by the foregoing preferred embodiments can also be obtained.

Although in the first to third preferred embodiments a longitudinally-coupled resonator mode SAW filter portion having three IDTs is preferably used, a longitudinally-coupled resonator mode SAW filter portion having more IDTs and less IDTs may be used. The SAW filter portion is not restricted to a longitudinally-coupled resonator mode type, and may be a length-coupled resonator mode type or a transversal-mode type.

In the first to third preferred embodiments, in addition to the SAW resonator 104, the SAW resonators 102 and 103 connected in series to the SAW filter portion 101 are preferably used. However, series-connected SAW resonators do not have to be provided. That is, it is sufficient that at least one parallel-connected SAW resonator be disposed, and the resonance point of the SAW resonator be positioned in the pass band of the SAW filter.

Figure 19:
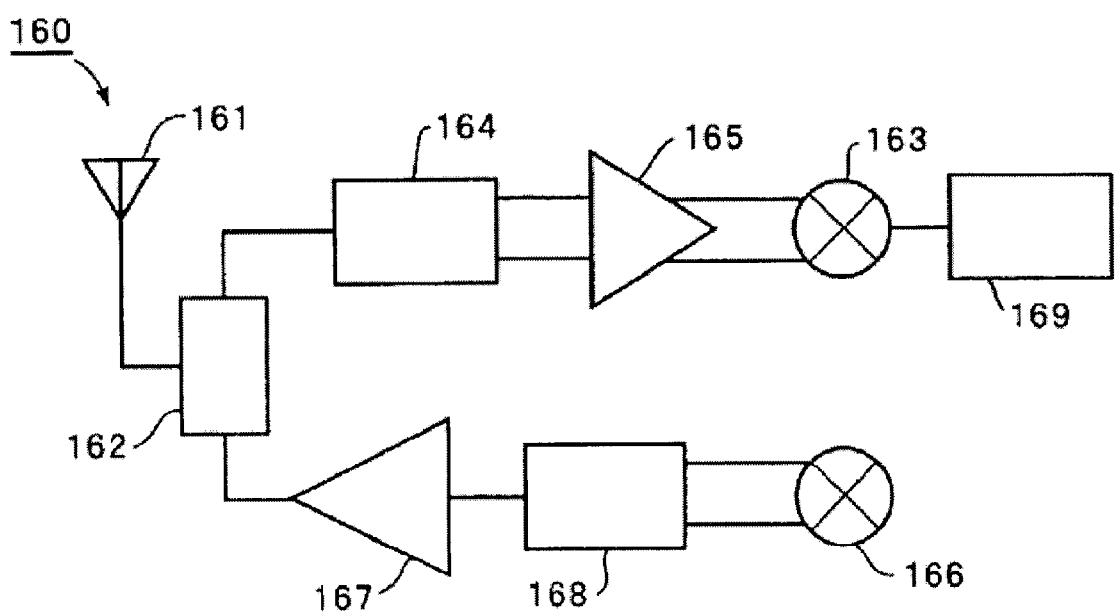
FIG. 19 is a block diagram schematically illustrating a communication apparatus provided with a SAW filter constructed in accordance with other preferred embodiments of the present invention.

FIG. 19 is a block diagram schematically illustrating a communication apparatus 160 provided with the SAW filter according to various preferred embodiments of the present invention.

In FIG. 19, a duplexer 162 is connected to an antenna 161. A SAW filter 164 and an amplifier 165, which form the RF stage, are connected between the duplexer 162 and a reception-side mixer 163. An IF-stage SAW filter 169 is connected to the mixer 163. Meanwhile, an amplifier 167 and a SAW filter 168, which define the RF stage, are connected between the duplexer 162 and a transmission-side mixer 166.

The SAW filter constructed in accordance with various preferred embodiments of the present invention is suitably used as the SAW filter 164 or 168 in the above-configured communication apparatus 160 according to yet another preferred embodiment of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave filter comprising:
   a piezoelectric substrate;
   a surface acoustic wave filter portion disposed on said piezoelectric substrate and having at least one interdigital transducer arranged to extend along a direction in which a surface acoustic wave propagates; and
   at least one surface acoustic wave resonator electrically connected in parallel with said surface acoustic wave filter portion such that said at least one surface acoustic wave resonator is disposed between an input terminal or an output terminal and said surface acoustic wave filter portion; wherein
   a resonance point of said surface acoustic wave resonator is disposed in a pass band of said surface acoustic wave filter portion.

2. A surface acoustic wave filter according to claim 1, wherein the resonance point of said surface acoustic wave resonator substantially coincides with a frequency at which an insertion loss in the pass band of said surface acoustic wave filter portion is minimized.

3. A surface acoustic wave filter according to claim 1, wherein a Q value of said surface acoustic wave resonator is about 190 or less.

4. A surface acoustic wave filter according to claim 1, further comprising a pair of balanced signal terminals and an unbalanced signal terminal, thereby providing a balanced-to-unbalanced conversion function.

5. A communication apparatus comprising a band pass filter defined by the surface acoustic wave filter according to claim 1.

6. A surface acoustic wave filter according to claim 1, wherein said piezoelectric substrate is one of a 40±5° Y-cut X-propagating LiTaO$_3$ substrate, a 64° to 72° Y-cut X-propagating LiNbO$_3$ substrate and a 41° Y-cut X-propagating LaNbO$_3$ substrate.

7. A surface acoustic wave filter according to claim 1, wherein at least three surface acoustic wave resonators are provided and two of the at east three surface acoustic wave resonators are connected in series to each other between the surface acoustic wave filter portion and the input terminal and the other of the at least three surface acoustic wave resonators is connected in parallel with the input terminal of the surface acoustic wave filter portion.

8. A surface acoustic wave filter according to claim 1, wherein the surface acoustic wave filter portion includes at least three interdigital electrodes arranged in the surface acoustic wave propagation direction and at least two reflectors disposed so as to sandwich the at least three interdigital electrodes.

9. A surface acoustic wave filter according to claim 1, wherein at least four surface acoustic wave resonators are provided and two of the at least four surface acoustic wave resonators are connected in series to each other between the surface acoustic wave filter portion and the input terminal and at least two of the at least four surface acoustic wave resonators are connected in parallel with the input terminal of the surface acoustic wave filter portion.

10. A surface acoustic wave filter comprising:
a piezoelectric substrate;
a surface acoustic wave filter portion disposed on said piezoelectric substrate and having at least one interdigital transducer arranged to extend along a direction in which a surface acoustic wave propagates; and
at least one surface acoustic wave resonator electrically connected in parallel with said surface acoustic wave filter portion such that said at least one surface acoustic wave resonator is disposed between an input terminal or an output terminal and said surface acoustic wave filter portion; wherein
a sub-resonance point of said surface acoustic wave resonator is disposed in a pass band of said surface acoustic wave filter portion.

11. A surface acoustic wave filter according to claim 10, wherein the sub-resonance point of said surface acoustic wave resonator substantially coincides with a frequency at which an insertion loss in the pass band of said surface acoustic wave filter portion is minimized.

12. A surface acoustic wave filter according to claim 10, wherein said surface acoustic wave resonator includes an interdigital transducer and reflectors disposed at both sides of the interdigital transducer in a direction in which a surface acoustic wave propagates, and a center-to-center distance of electrode fingers between the interdigital transducer and each of the reflectors is approximately [(0.50 through 0.80)+ 0.50n] times (n is −1, 0, 1, 2, and so on) a wavelength, which is determined by an electrode finger pitch of the interdigital transducer.

13. A surface acoustic wave filter according to claim 10, further comprising a pair of balanced signal terminals and an unbalanced signal terminal, thereby providing a balanced-to-unbalanced conversion function.

14. A communication apparatus comprising a bandpass filter defined by the surface acoustic wave filter set forth in claim 10.

15. A surface acoustic wave filter according to claim 10, wherein said piezoelectric substrate is one of a 40±5° Y-cut X-propagating $LiTaO_3$ substrate, a 64° to 72° Y-cut X-propagating $LiNbO_3$ substrate and a 41° Y-cut X-propagating $LaNbO_3$ substrate.

16. A surface acoustic wave filter according to claim 10, wherein at least three surface acoustic wave resonators are provided and two of the at least three surface acoustic wave resonators are connected in series to each other between the surface acoustic wave filter portion and the input terminal and the other of the at least three surface acoustic wave resonators is connected in parallel with the input terminal of the surface acoustic wave filter portion.

17. A surface acoustic wave filter according to claim 10, wherein the surface acoustic wave filter portion includes at least three interdigital electrodes arranged in the surface acoustic wave propagation direction and at least two reflectors disposed so as to sandwich the at least three interdigital electrodes.

18. A surface acoustic wave filter according to claim 10, wherein at least four surface acoustic wave resonators are provided and two of the at least four surface acoustic wave resonators are connected in series to each other between the surface acoustic wave filter portion and the input terminal and at least two of the at least four surface acoustic wave resonators are connected in parallel with the input terminal of the surface acoustic wave filter portion.

* * * * *